United States Patent
Foong et al.

(10) Patent No.: US 9,134,193 B2
(45) Date of Patent: Sep. 15, 2015

(54) STACKED DIE SENSOR PACKAGE

(71) Applicants: Chee Seng Foong, Sg. Buloh (MY); Lau Teck Beng, Petaling Jaya (MY); Sheng Ping Took, Subang Jaya (MY)

(72) Inventors: Chee Seng Foong, Sg. Buloh (MY); Lau Teck Beng, Petaling Jaya (MY); Sheng Ping Took, Subang Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 77 days.

(21) Appl. No.: 14/098,559

(22) Filed: Dec. 6, 2013

(65) Prior Publication Data

US 2015/0160087 A1 Jun. 11, 2015

(51) Int. Cl.
| | |
|---|---|
| H01L 23/02 | (2006.01) |
| H01L 23/12 | (2006.01) |
| G01L 9/00 | (2006.01) |
| H01L 23/31 | (2006.01) |
| H01L 23/00 | (2006.01) |
| B60C 23/00 | (2006.01) |
| H01L 23/495 | (2006.01) |
| H01L 21/56 | (2006.01) |

(52) U.S. Cl.
CPC .............. G01L 9/0098 (2013.01); B60C 23/00 (2013.01); H01L 23/3107 (2013.01); H01L 23/49551 (2013.01); H01L 23/49575 (2013.01); H01L 24/09 (2013.01); H01L 24/49 (2013.01); H01L 21/561 (2013.01); H01L 2224/4941 (2013.01); H01L 2224/49174 (2013.01)

(58) Field of Classification Search
USPC ................................................ 257/686, 704
See application file for complete search history.

(56) References Cited

U.S. PATENT DOCUMENTS

| | | | |
|---|---|---|---|
| 5,523,608 A * | 6/1996 | Kitaoka et al. ................. | 257/433 |
| 6,379,988 B1 | 4/2002 | Peterson | |
| 6,603,072 B1 * | 8/2003 | Foster et al. .................. | 174/536 |
| 6,891,239 B2 | 5/2005 | Anderson | |
| 6,927,482 B1 * | 8/2005 | Kim et al. ...................... | 257/670 |
| 7,040,154 B2 | 5/2006 | Shaw | |
| 7,060,216 B2 | 6/2006 | Schuurmans | |
| 7,215,008 B2 * | 5/2007 | Kim et al. ...................... | 257/666 |
| 7,282,786 B2 * | 10/2007 | Jung et al. ..................... | 257/666 |
| 7,468,556 B2 * | 12/2008 | Logan et al. .................. | 257/723 |
| 7,576,440 B2 * | 8/2009 | Song et al. .................... | 257/786 |
| 7,781,852 B1 | 8/2010 | Faheem | |
| 7,868,471 B2 * | 1/2011 | Camacho et al. ............. | 257/790 |
| 8,178,961 B2 * | 5/2012 | Han et al. ...................... | 257/686 |
| 8,359,927 B2 | 1/2013 | Hooper | |
| 8,482,112 B1 * | 7/2013 | Liou et al. ..................... | 257/686 |
| 2009/0134481 A1 | 5/2009 | Sengupta | |
| 2012/0139067 A1 * | 6/2012 | Lo et al. ........................ | 257/417 |
| 2013/0075884 A1 | 3/2013 | Gong | |
| 2014/0245384 A1 * | 8/2014 | Shieh et al. ....................... | 726/2 |

* cited by examiner

*Primary Examiner* — Luan C Thai
(74) *Attorney, Agent, or Firm* — Charles Bergere

(57) ABSTRACT

A stacked die sensor package includes a die paddle and lead fingers that surround the die paddle. The lead fingers have proximal ends near the die paddle and distal ends spaced from the die paddle. A first semiconductor die is mounted to one side of the die paddle and electrically connected to the lead fingers with first bond wires. A sensor die is mounted to the other side of the die paddle and electrically connected to the lead fingers with sensor bond wires. An encapsulation material covers the first die and the first bond wires, while a gel material and a lid cover the sensor die and the sensor bond wires. The package may also have a second semiconductor die attached on an active surface of the first die and electrically connected one or both of the lead fingers or first die bonding pads with second bond wires.

15 Claims, 9 Drawing Sheets

FIG. 4     400

STACKED DIE SENSOR PACKAGE

BACKGROUND OF THE INVENTION

The present invention relates generally to stacked die semiconductor packaging and, more particularly, to a stacked die package having a sensor die.

Packaged semiconductors provide external electric connections and physical protection for packaged dies. Continued progress in reduction of the size of the semiconductor dies, and increased functionality of the circuits integrated in the dies, requires size reduction of the packaging with the same or greater number of external electrical connectors.

One typical type of semiconductor package is a Quad Flat Pack (QFP), which is formed with a semiconductor die mounted to a lead frame. The lead frame is formed from a sheet of metal that has a die attach pad often called a die paddle or die flag and arms or tie bars that attach the flag to a frame. Lead fingers of the lead frame are wire bonded to bonding pads the die to provide a means of easily electrically connecting the die to circuit boards and the like. After the die bonding pads and the lead fingers are wire bonded, the semiconductor die and bond wires are encapsulated with a plastic material leaving only sections of the lead fingers exposed. These exposed leads are cut from the frame (singulated) and bent for ease of connection to a circuit board.

When sensors such pressure sensors used in tire pressure monitoring systems are packaged, the mounting surface area (footprint) may increase by at least the area of the active surface of the sensors. Stacking of a die and sensor in a semiconductor package can reduce the mounting surface area. However, the active surface of the sensor must face away from the mounting surface in order to properly function. Furthermore, the sensor (sensor die) cannot easily be encapsulated with the plastics material together with the other dies in the package, in a single molding step, as the sensor die is sensitive to stress induced by conventional molding processes. Therefore, it would be advantageous to have an efficient and economical method to package a sensor die with other semiconductor dies.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
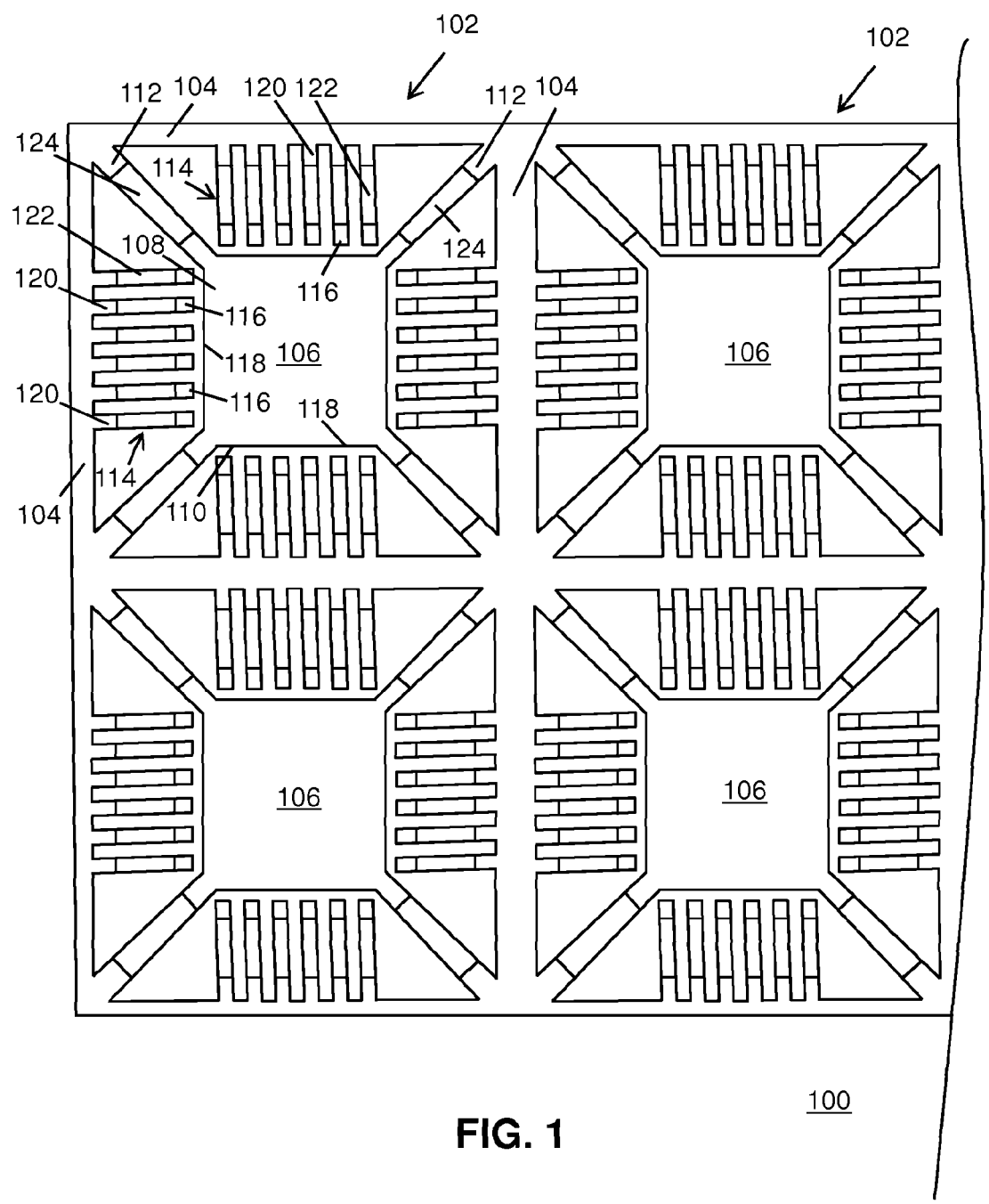
FIG. 1 is a top plan view of a lead frame sheet, used for making a stacked sensor and semiconductor die package, in accordance with a preferred embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a stacked die sensor package including a die paddle having a first side and an opposite second side. Lead fingers, each having a proximal end near a respective edge of the die paddle and a distal end, surround the die paddle and provide an external electrical connection for the package. A first semiconductor die having an active surface with die bonding pads and an opposite die mount surface is attached to the first side of the die paddle. A sensor die having an active surface with sensor bonding pads and an opposite sensor surface is attached to the second side of the die paddle. Die bond wires selectively electrically connect the die bonding pads to the proximal ends of the lead fingers, and sensor bond wires electrically connect the sensor bonding pads to the proximal ends of the lead fingers. An encapsulant covers the semiconductor die and the die bond wires, while a gel material and a lid cover the sensor die and the sensor bond wires.

In another embodiment, the present invention provides a method for assembling a stacked die sensor package. The method includes providing an electrically conductive lead frame sheet that has a plurality of lead frames. Each of the lead frames has an outer frame surrounding a die paddle with a first side and an opposite second side. The die paddle is supported from the outer frame by tie bars. The lead frame has lead fingers, each with a proximal end near a respective edge of the die paddle and a distal end adjacent and integral with the outer frame. The method also includes attaching a first semiconductor die to the first side of the die paddle and a sensor die to the second side of the die paddle. Die bonding pads on an active surface of the first die are electrically connected to proximal ends of the lead fingers with die bond wires, while sensor bonding pads on an active surface of the sensor die are electrically connected with proximal ends of the lead fingers with sensor bond wires. A molding process is performed to encapsulate the first semiconductor die and the die bond wires. The method also includes covering the sensor and sensor bond wires with a gel material and a lid, and separating the outer frame from the lead fingers and tie bars.

Referring now to FIG. 1, a top plan view of an electrically conductive lead frame sheet 100, used for making a stacked sensor and semiconductor die package, in accordance with a preferred embodiment of the present invention, is shown. The lead frame sheet 100 is typically formed of metal such as copper, which may or may not be partially or fully plated, as is known in the art. The sheet 100 has a plurality of lead frames 102 in an array and the lead frames 102 are typically formed by punching or cutting out regions of the sheet 100.

Each of the lead frames 102 has an outer frame 104 that surrounds a centrally located die paddle 106 that has a first side 108 and an opposite second side 110. Tie bars 112 extend inwardly from the outer frame 104 to support the die paddle 106. Lead fingers 114 also extend inwardly from the outer frame 104 towards respective edges 118 of the die paddle 106. Each of the lead fingers 114 has a proximal end 116 near the respective edge 118 of the die paddle 106 and a distal end 120 adjacent and integral with the outer frame 104. The lead fingers 114 each have an angled intermediate region 122 that is angled to form a down-set relationship between the distal end 120 (plus the outer frame 104) and the proximal end 116. Similarly, the tie bars 112 each has an angled region 124 that is angled to form a down-set relationship between the die paddle 106 and the outer frame 104.

Figure 2:
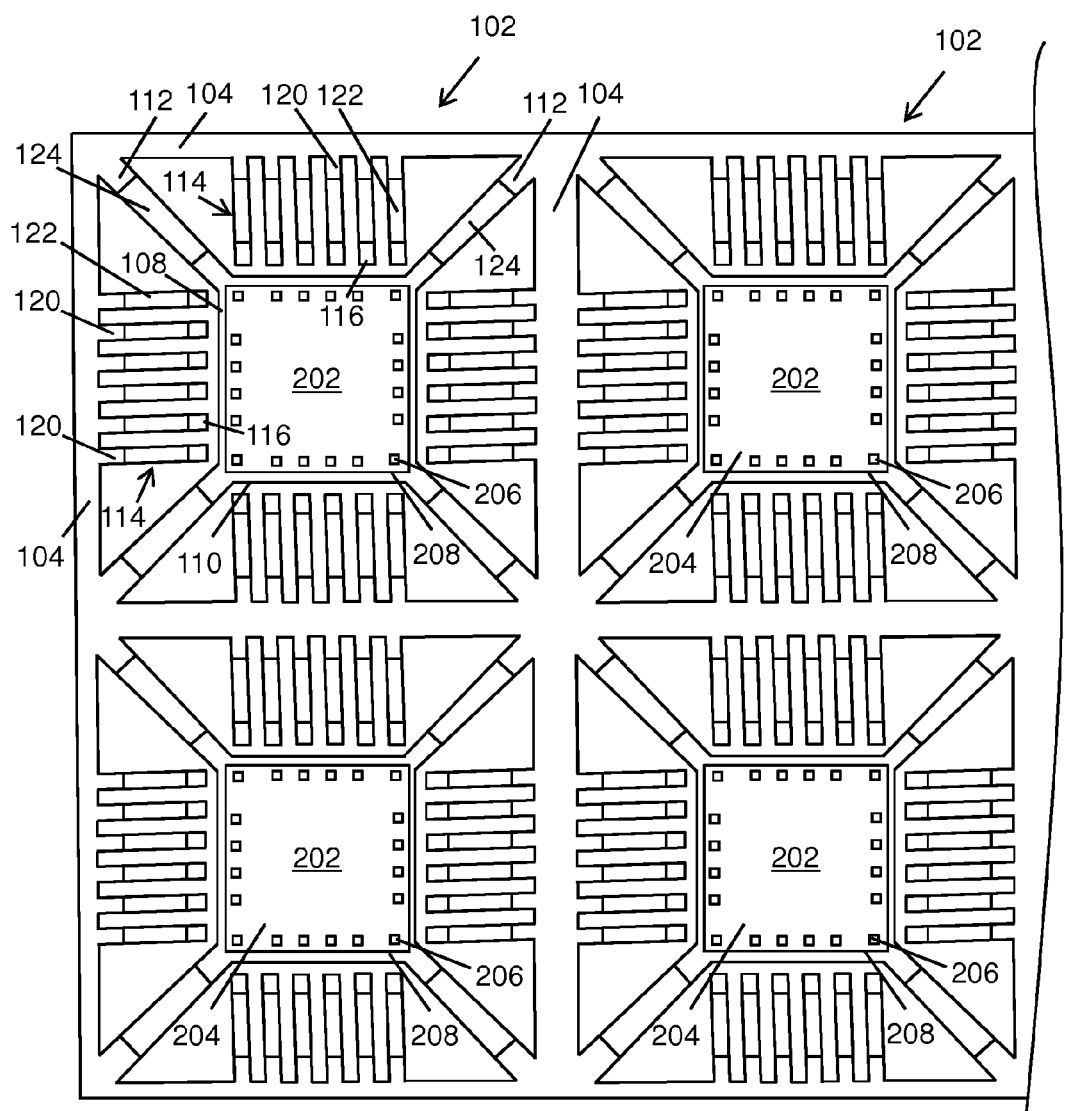
FIG. 2 is a top plan view of a semiconductor die and sheet assembly formed from the sheet of FIG. 1 in accordance with a preferred embodiment of the present invention.

FIG. 2 shows a top plan view of a semiconductor die and sheet assembly 200, formed from the sheet 100, in accordance with a preferred embodiment of the present invention. The assembly 200 includes a first semiconductor die 202 that has an active surface 204 with first die bonding pads 206 and an opposite die mount surface 208 attached to the first side 108 of the die paddle 106. Typically, the die mount surface 208 is attached to the first side 108 of the die paddle 106 with an epoxy resin or other bonding agent.

Figure 3:
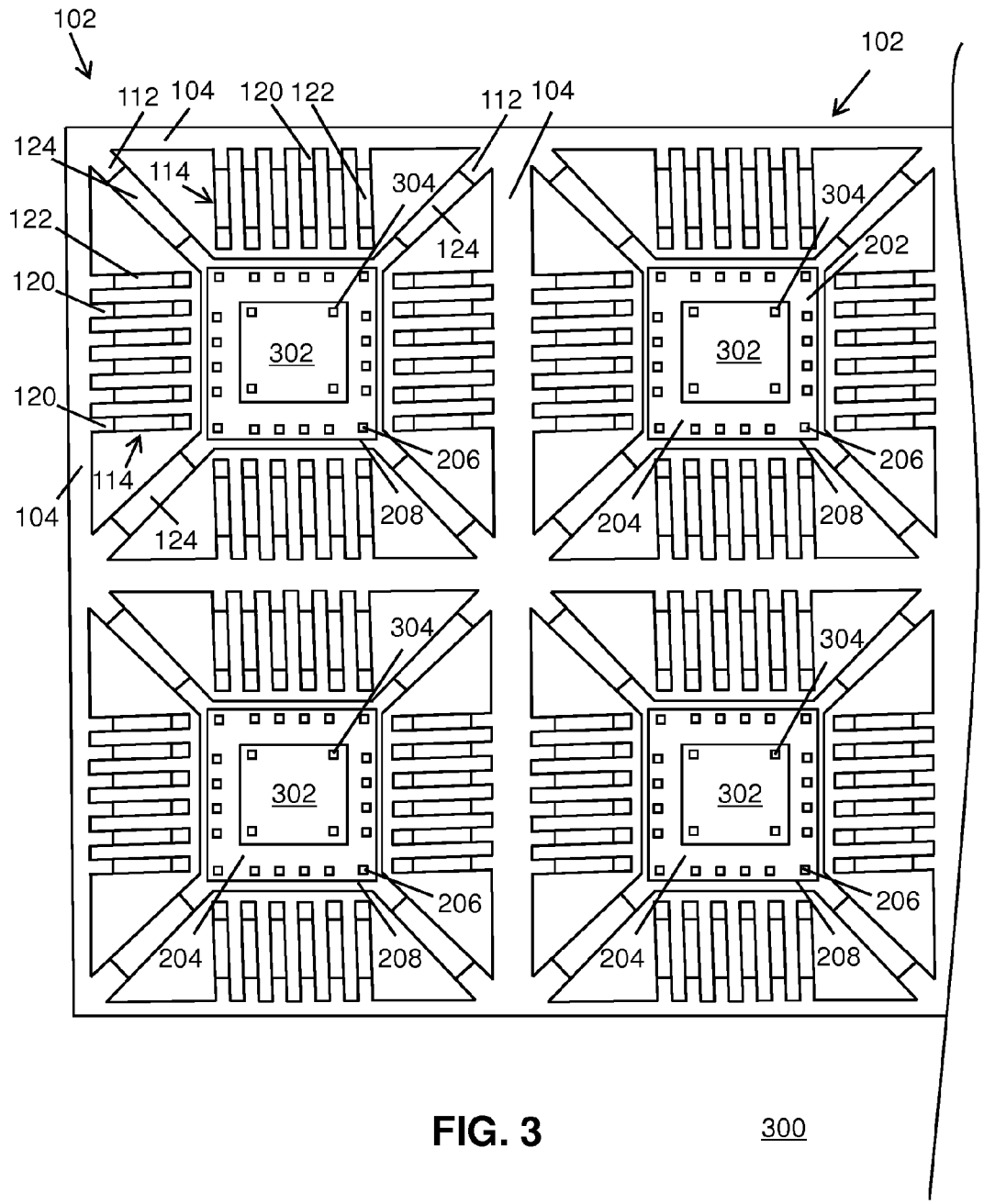
FIG. 3 is a top plan view of a stacked die assembly, formed from the semiconductor die and sheet assembly of FIG. 2, in accordance with a preferred embodiment of the present invention.

FIG. 3 is a top plan view of a stacked die assembly 300, formed from the semiconductor die and sheet assembly 200, in accordance with a preferred embodiment of the present invention. The assembly 300 includes a second die 302 mounted on the active surface 204 of the first die 202 with an epoxy resin or similar bonding agent. The second die 302 has second die bonding pads 304 as will be apparent to a person skilled in the art.

Figure 4:
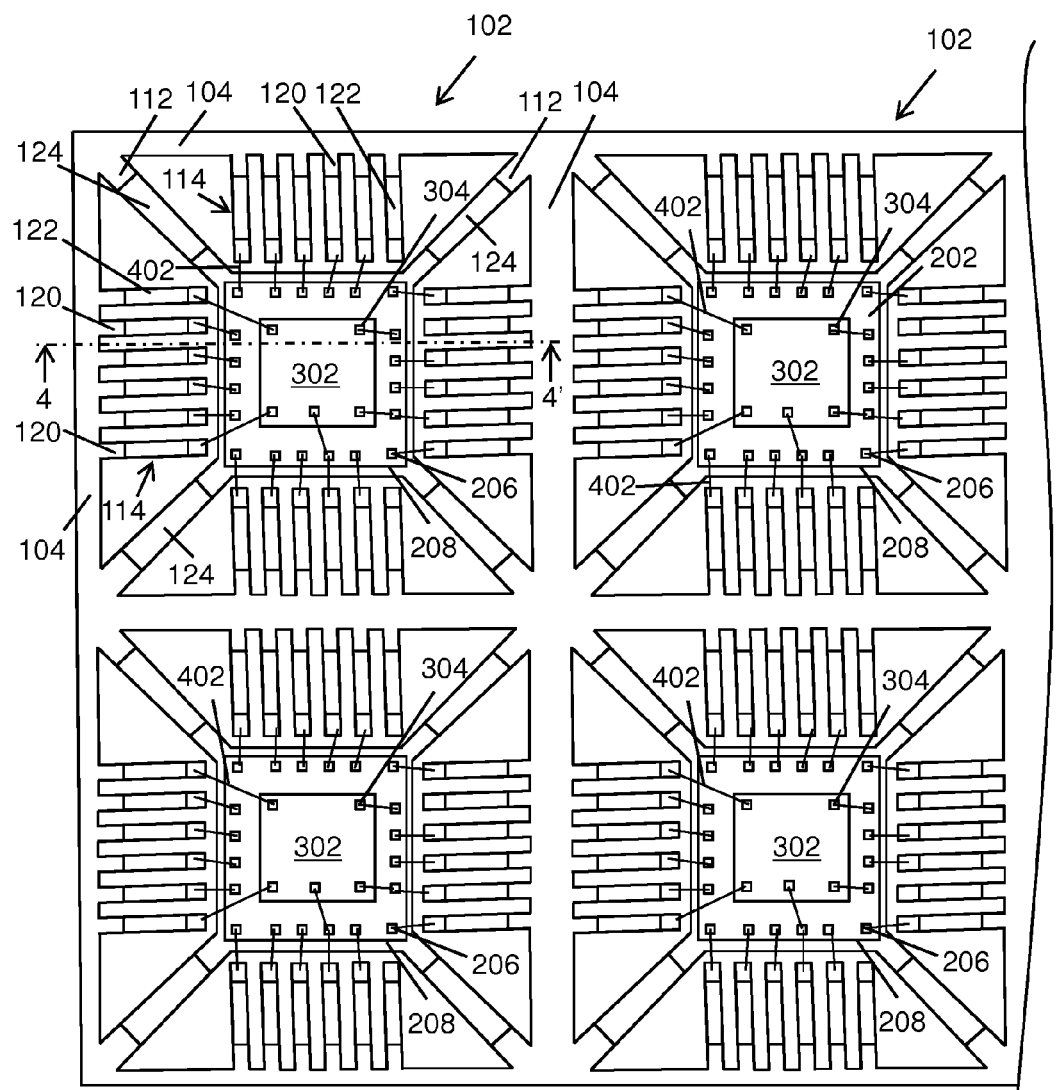
FIG. 4 is a top plan view of a partially wire bonded stacked die assembly, formed from the stacked die assembly of FIG. 3, in accordance with a preferred embodiment of the present invention

FIG. 4 illustrates a top plan view of a partially wire bonded stacked die assembly 400, formed from the stacked die assembly 300, in accordance with a preferred embodiment of the present invention. As illustrated, the assembly 400 includes die bond wires 402 selectively electrically connecting the first die bonding pads 206 to the lead fingers 114 at their respective proximal ends 116. The die bond wires 402 also selectively electrically connect the second die bonding pads 304 to the lead fingers 114 at their respective proximal ends 116. Additionally, the die bond wires 402 may also selectively electrically couple the second die bonding pads 304 to the first die bonding pads 206.

Figure 5:
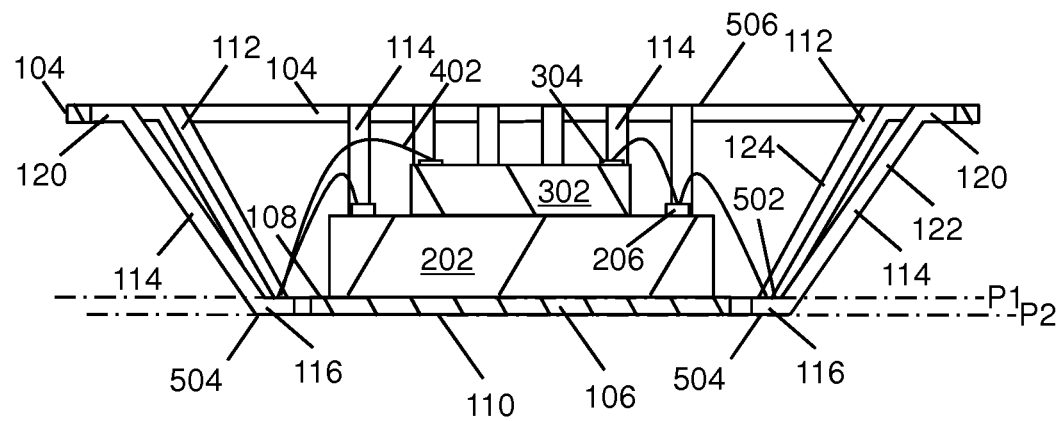
FIG. 5 is a cross-sectional side view, through 4-4', of the partially wire bonded stacked die assembly of FIG. 4.

Referring now to FIG. 5, a cross-sectional side view, through 4-4', of the partially wire bonded stacked die assembly 400 is illustrated. As shown, the angled region 124 is configured to form the down-set relationship such that the first side 108 of the die paddle 108 is coplanar, along a plane P1 with a first wire bonding side 502 of each proximal end 116. Furthermore, the opposite second side 110 of the die paddle 108 is coplanar, along a plane P2, with a second wire bonding side 504 of each proximal end 116. Thus, as shown the die bond wires 402 are bonded to the first wire bonding side 502 and the sensor bond wires 902 are bonded to the second wire bonding side 504. As can be seen in this view, the angled region 124 of each of the tie bars 112 is of a sufficient length so that the second die 302 and second die bond wires do not protrude above an outwardly facing surface 506 of the outer frame 104.

Figure 6:
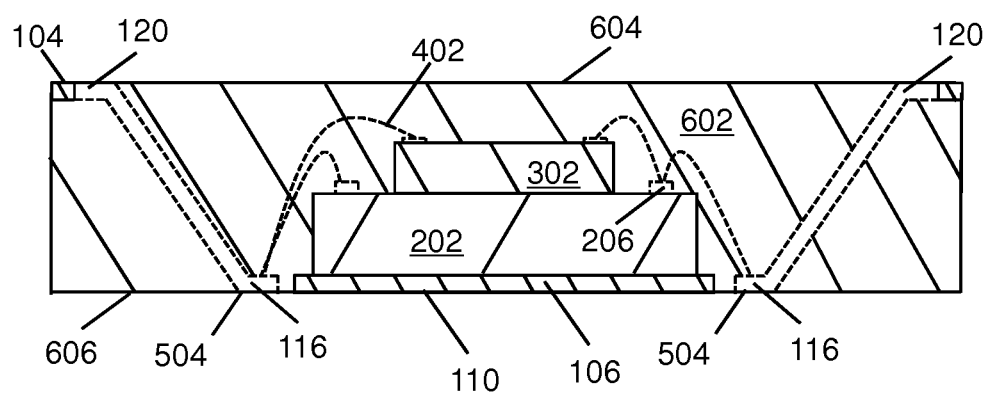
FIG. 6 is cross-sectional side view of an encapsulated, partially wire bonded stacked die assembly, formed from the assembly of FIG. 4, in accordance with a preferred embodiment of the present invention.

FIG. 6 is a cross-sectional side view of an encapsulated, partially wire bonded stacked die assembly 600, formed from the assembly 400, in accordance with a preferred embodiment of the present invention. The assembly 600 includes an encapsulating material 602 that covers the first die 202, the second die 302 and the die bond wires 404. The encapsulating material 602 is typically press moulded and forms an outer package base surface 604 and an opposite surface 606. The encapsulating material 602 is moulded in a manner that allows each distal end 120 and the outer frame 104 to be exposed from the encapsulating material 602 at the outer package base surface 604. Similarly, each proximal end 116 and the die paddle 106 are exposed from the encapsulating material 602 at the opposite surface 606.

Figure 7:
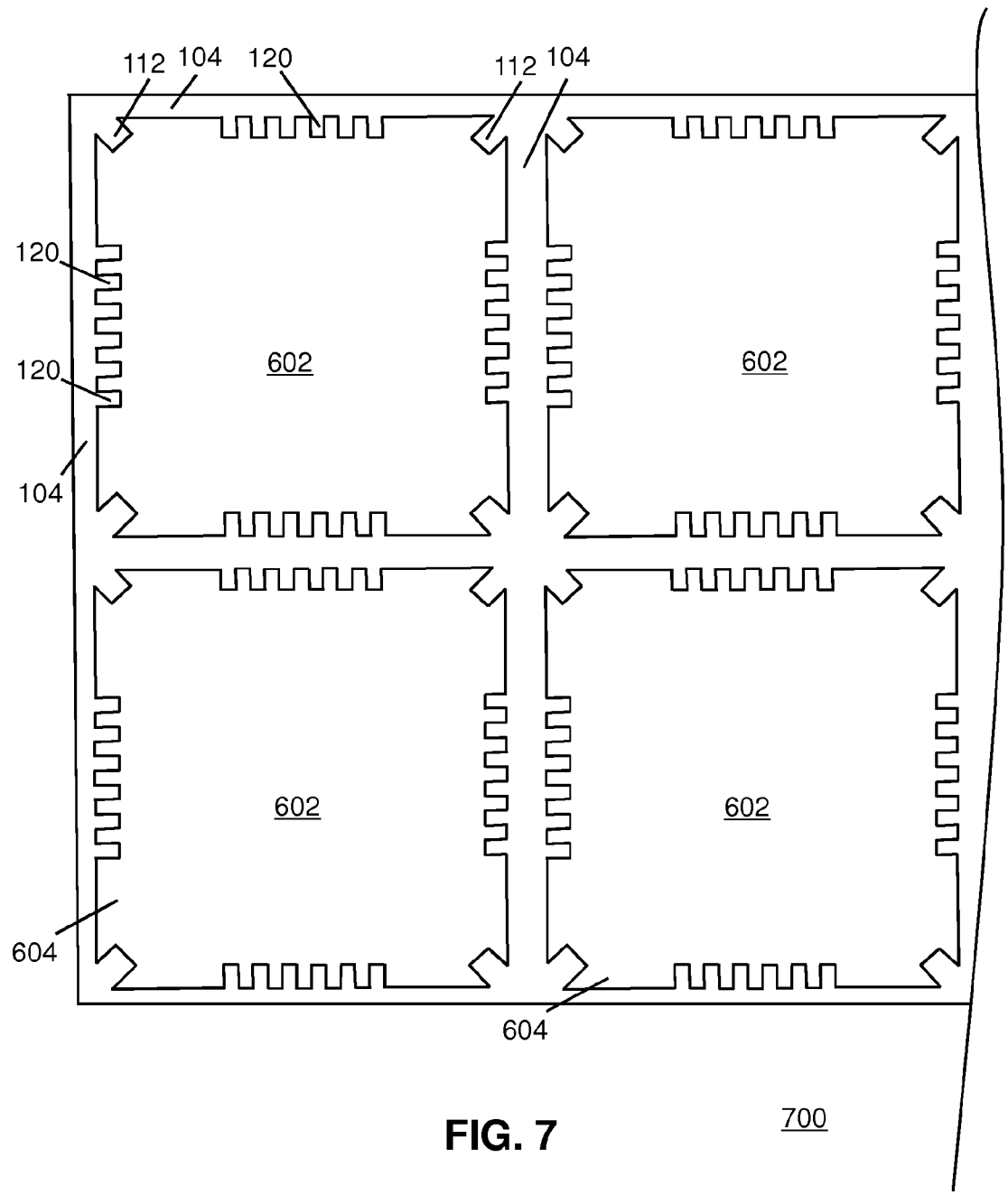
FIG. 7 is a top plan view of the encapsulated, partially wire bonded stacked die assembly of FIG. 6 when populating the lead frame sheet of FIG. 1 with other identical assemblies.

Referring to FIG. 7, a top plan view of the encapsulated partially wire bonded stacked die assembly 600 when populating the lead frame sheet 100 with other such assemblies is shown. As illustrated, each distal end 120 and the outer frame 104 protrude from the outer package base surface 604. Also, part of each tie bar 112 protrudes from the outer package base surface 604.

Figure 8:
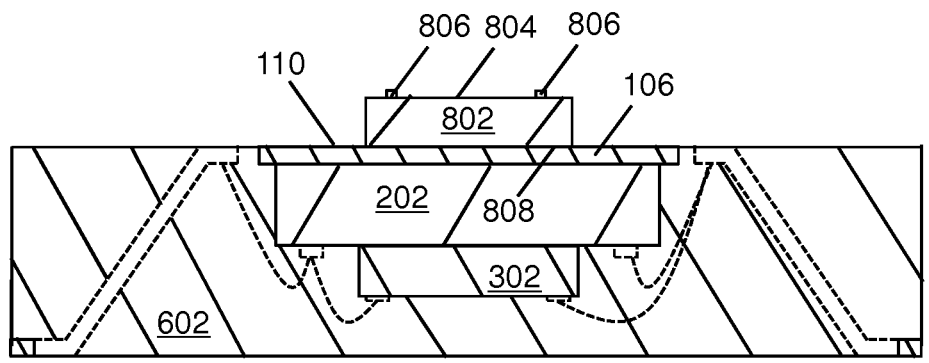
FIG. 8 is an upright cross-sectional side view of a partially formed stacked sensor assembly, formed from the assembly of FIG. 7, in accordance with a preferred embodiment of the present invention.

FIG. 8 illustrates an upright cross-sectional side view of a partially formed stacked sensor assembly 800, formed from the assembly 600, in accordance with a preferred embodiment of the present invention. The assembly 600 has been inverted and a sensor die 802 is mounted on the opposite second side 110 of the die paddle 106. The sensor 802 has a sensor active surface 804 with sensor bonding pads 806 and an opposite sensor surface 808 attached to the second side 110 of the die paddle 106 with an epoxy resin or other bonding agent.

Figure 9:
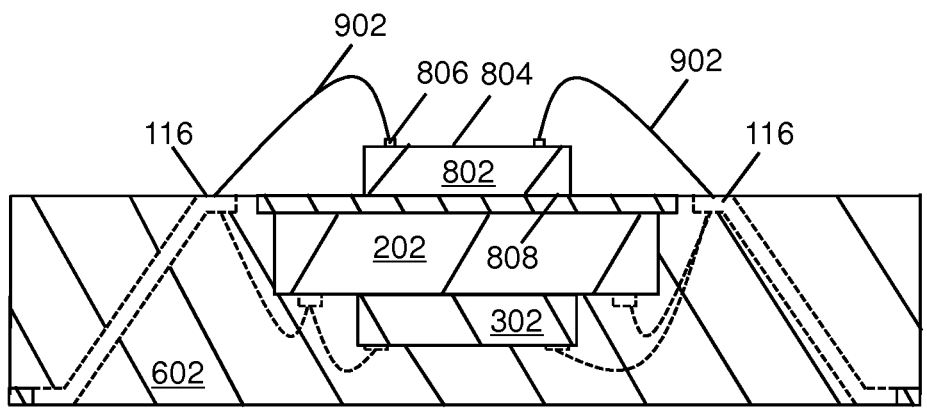
FIG. 9 is a cross-sectional side view of a wire bonded formed stacked sensor assembly, formed from the assembly of FIG. 8, in accordance with a preferred embodiment of the present invention.

FIG. 9 is a cross-sectional side view of a wire bonded stacked sensor assembly 900, formed from the assembly 800, in accordance with a preferred embodiment of the present invention. The assembly 900 includes sensor bond wires 902 that selectively electrically connect the sensor bonding pads 806 to the lead fingers 114 at their respective proximal ends 116.

Figure 10:
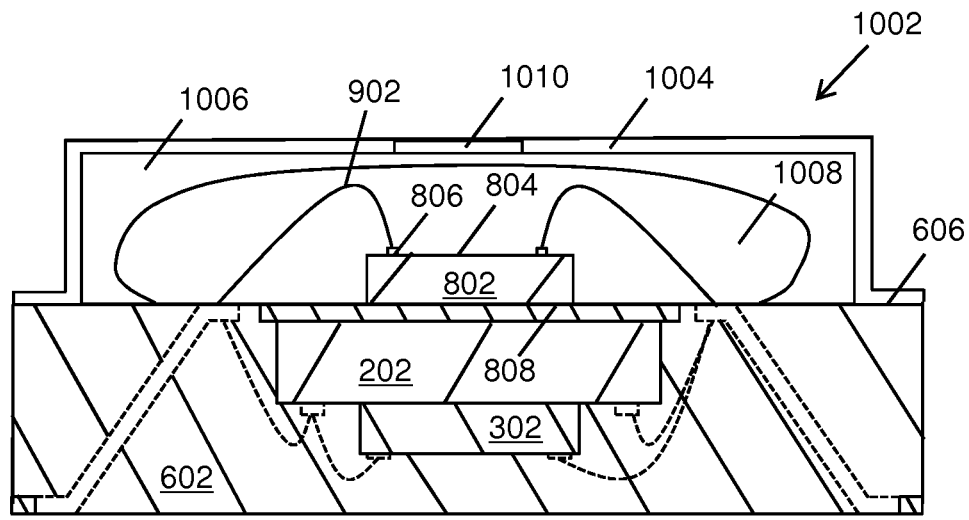
FIG. 10 is a cross-sectional side view of a stacked sensor assembly, formed from the assembly of FIG. 9, in accordance with a preferred embodiment of the present invention.

FIG. 10 is a cross-sectional side view of a stacked sensor assembly 1000, formed from the assembly 900, in accordance with a preferred embodiment of the present invention. The assembly 1000 includes a protective covering 1002 that covers and protects the sensor active surface 1610, the sensor bond wires 902 and the sensor bonding pads 806. The covering 1002 includes a lid 1004 mounted to the opposite package surface 606 and affixed with an epoxy or other bonding agent.

The lid 1004 has a chamber 1006 that is at least partially filled with a non-electrically conductive gel 1008 that is typically a transparent silicon based gel. The lid 1004 also has an aperture 1010 that provides a window for the sensor 802 to detect ambient conditions outside the lid 1004. In one embodiment, the assembly comprises a pressure monitoring system such as used for measuring the pressure of an automobile tire, where the first die 202 is a controller, the second die 302 is an accelerometer, and the sensor die 802 is a pressure sensor.

Figure 11:
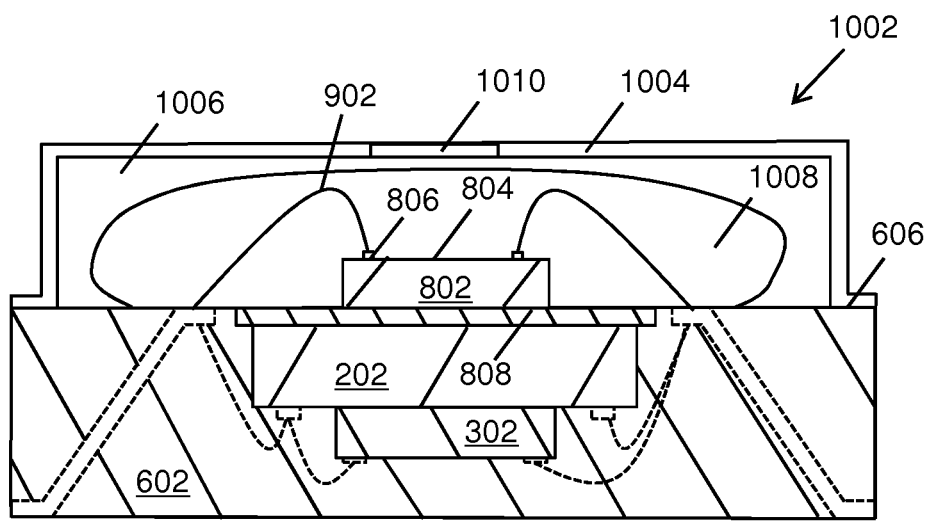
FIG. 11 is a cross-sectional side view of a stacked sensor and semiconductor die package, formed from assembly of FIG. 10, in accordance with a preferred embodiment of the present invention.

FIG. 11 is a cross-sectional side view of a stacked sensor and semiconductor die package 1100, formed from assembly 1000, in accordance with a preferred embodiment of the present invention. The package 1100 has been separated (singulated) from the lead frames in the sheet 110. As is known in the art, singulation includes cutting or punching the distal ends 120 and tie bars 112 from the outer frame 104. Singulation also includes cutting the encapsulating material 606 and edges of the lid 1004 as will also be apparent to a person skilled in the art.

The sensor die 802 is a pressure sensor, although other sensors are possible such an optical sensor or any ambient condition sensor. Also, the first semiconductor die 202 is typically a microcontroller and the second die 302 is typically an accelerometer. The distal end 116 of each of the lead fingers 114 provides an external electrical connection for the package 1100. Also, selective internal package connections between the sensor die pads 806 and the first die bonding pads 206 is provided by selective use of the proximal regions 116 and bond wires 402, 902.

Figure 12:
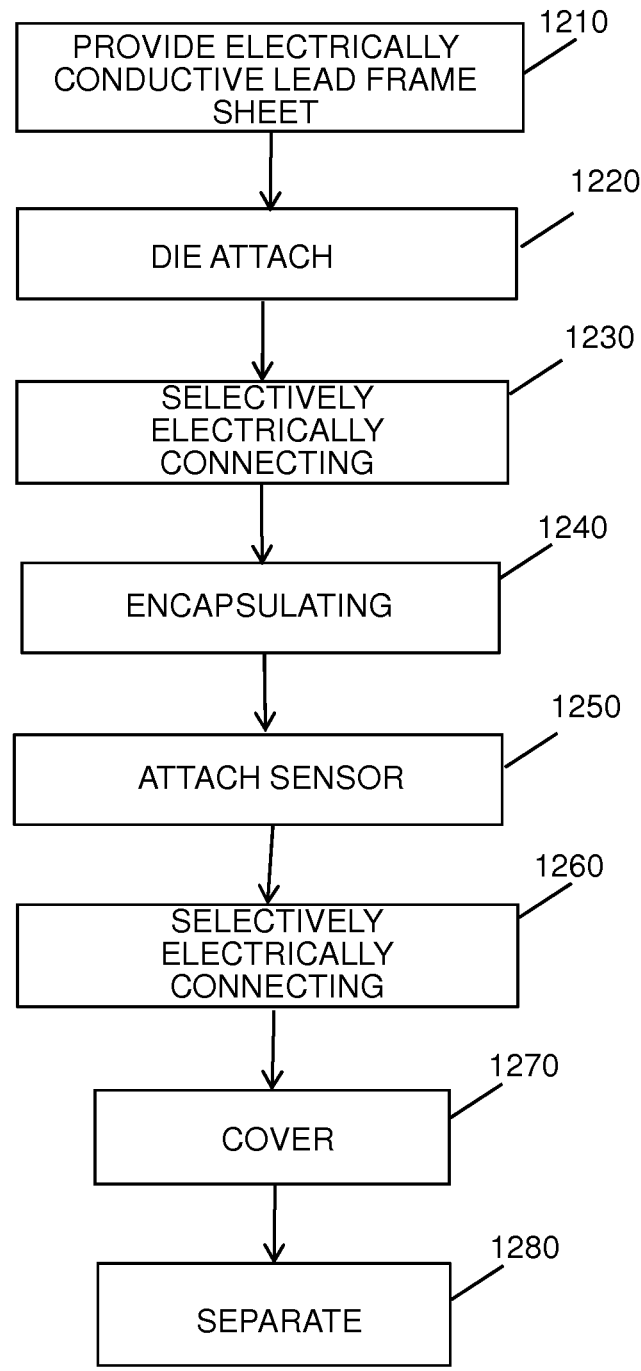
FIG. 12 is a flow chart of a method for assembling a stacked die sensor package in accordance with a preferred embodiment of the present invention.

Referring now to FIG. 12, a flow chart illustrating a method 1200 for assembling a stacked die sensor package in accordance with a preferred embodiment of the present invention is shown. By way of explanation only, the method 1200 will be described with particular reference to FIGS. 1 to 11. At a providing step 1210, the electrically conductive lead frame sheet 100 is provided, and at an attaching step 1220 the first die 202 is attached to the first side of the die paddle 108. If required, the mounting of the second die 302 on the active surface 204 of the first die 202 may also be performed. After the first die 202 is attached to the first side of the die paddle 108, the semiconductor die and sheet assembly 200 is formed.

At a connecting step 1230, a wire bonding process is performed. The wire bonding process selectively electrically connects the first die bonding pads 206 and the second die pads 304 (if there is a second die), to the lead fingers 114 at their proximal ends 116. The connecting is provided by the die bond wires 402. After the connection is performed, the partially wire bonded stacked die assembly 400 is formed. Next, at an encapsulating step 1240, the first die 202, second die 302 and first die bond wires 402 are encapsulated with the encapsulating material 602. This forms the encapsulated partially wire bonded stacked die assembly 600.

The lead frame sheet that is populated with the encapsulated partially wire bonded stacked die assembles 600 is then flipped over. At an attaching step 1250, the sensor die 802 is attached to the second side 110 of the die paddle 106 to provide the partially formed stacked sensor assembly 800. Then, at a connecting step 1260, a further wire bonding process is performed. This further wire bonding process selectively electrically connects the sensor bonding pads 806 to the lead fingers 114 at their respective proximal ends 116. The connecting is provided by the sensor bond wires 806.

At a covering step 1270, the sensor 802 and sensor bond wires 806 are covered with the protective covering 1002. Individual stacked sensor and semiconductor die packages 1100 are then formed, at a separating block 1280, when the outer frame is separated from the lead fingers 114 and tie bars 112. As will be apparent to a person skilled in the art, the encapsulating material 602 is also cut (singulated) to form the individual packages 1100.

Advantageously, the present invention provides for a relatively inexpensive stacked sensor and semiconductor die package 1100 in which the active surface 804 of the sensor die 802 faces away from the mounting surface of the package 1100.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A stacked die sensor package, comprising:
   a die paddle having a first side and an opposite second side;
   lead fingers that surround the die paddle, each lead finger having a proximal end near a respective edge of the die paddle and a distal end providing an external electrical connection for the package;
   a first semiconductor die having an active surface with first die bonding pads and an opposite die mount surface attached to the first side of the die paddle;
   a sensor die having a sensor active surface with sensor die bonding pads and an opposite sensor surface attached to the second side of the die paddle;
   sensor bond wires selectively electrically connecting the sensor die bonding pads to the proximal ends of the lead fingers;
   die bond wires selectively electrically connecting the first die bonding pads to the proximal ends of the lead fingers;
   an encapsulating material that covers the first semiconductor die and the die bond wires, wherein the encapsulating material has an outer package base surface and an opposite planar surface and the lead fingers distal ends are exposed from the encapsulating material at the outer package base surface for providing the external electrical connections, and the lead fingers proximal ends are exposed from the encapsulating material at the opposite planar surface; and
   a footed lid mounted to the opposite planar surface of the encapsulating material and covering the sensor die and the sensor bond wires, wherein the footed lid includes a hole in a surface thereof.

2. The stacked die sensor package of claim 1, further comprising a second semiconductor die mounted on the active surface of the first semiconductor die.

3. The stacked die sensor package of claim 2, further comprising second die bonding wires selectively electrically connecting bonding pads of the second semiconductor die to the proximal ends of the lead fingers.

4. The stacked die sensor package of claim 1, wherein at least one of the proximal ends provides an internal package connection between one of the sensor bonding pads and one of the first die bonding pads.

5. The stacked die sensor package of claim 1, further comprising:
   a gel material that covers the sensor die and the sensor bond wires.

6. The stacked die sensor package of claim 1, wherein each lead finger proximal end has a first wire bonding side and a second wire bonding side, and wherein the first wire bonding side is coplanar with the first side of the die paddle and the second wire bonding side is coplanar with the opposite second side of the die paddle.

7. The stacked die sensor package of claim 6, wherein the first die bond wires are bonded to the first wire bonding side and the sensor bond wires are bonded to the second wire bonding side.

8. The stacked die sensor package of claim 5, wherein the gel material is a non-electrically conductive gel.

9. The stacked die sensor package of claim 5, wherein the gel material is disposed within a chamber formed by the footed lid.

10. A tire pressure monitoring system, comprising:
a die paddle having a first side and an opposite second side;
lead fingers that surround the die paddle, each lead finger having a proximal end near a respective edge of the die paddle and a distal end further from the die paddle and for providing an external electrical connection for the system;
a controller die having an active surface with first die bonding pads and an opposite die mount surface that is attached to the first side of the die paddle;
an acceleration sensor die having an active surface with second die bonding pads and an opposite mounting surface attached to the active surface of the controller die;
a pressure sensor die having a sensor active surface with sensor die bonding pads and an opposite back side surface attached to the second side of the die paddle;
pressure sensor bond wires selectively electrically connecting the sensor die bonding pads to the proximal ends of the lead fingers;
controller die bond wires selectively electrically connecting the first die bonding pads to the proximal ends of the lead fingers;
acceleration sensor bond wires selective electrically connecting the second die bonding pads to the first die bonding pads;
an encapsulating material that covers the controller die, the acceleration sensor die, the controller die bond wires and the acceleration sensor bond wires, wherein the encapsulating material has an outer package base surface and a planar inner package base surface and wherein the distal ends of the lead fingers are exposed from the encapsulating material at the outer package base surface for providing the external electrical connections, and the proximal ends of the lead fingers are exposed from the encapsulating material at the planar inner package surface to allow attachment of the pressure sensor bond wires thereto;
a non-conductive gel material covering the pressure sensor die and the pressure sensor bond wires; and
a footed lid attached to the planar inner package surface of the encapsulating material and covering the pressure sensor die, the pressure sensor bond wires and the gel material, and wherein the lid has a hole in a surface thereof to facilitate operation of the pressure sensor die.

11. A method for assembling a stacked die sensor package, the method comprising:
providing an electrically conductive lead frame sheet that has a plurality of lead frames, each of the lead frames having an outer frame surrounding a die paddle with a first side and an opposite second side, the die paddle being supported from the outer frame by tie bars, and wherein each of the lead frames has lead fingers each with a proximal end near a respective edge of the die paddle and a distal end adjacent and integral with the outer frame;
attaching a first semiconductor die to the first side of the die paddle of one of the lead frames, the first semiconductor die having an active surface with first die bonding pads and an opposite die mount surface that is attached to the first side of the die paddle;
selectively electrically connecting the first die bonding pads to the proximal ends of the lead fingers with first die bond wires;
encapsulating the first semiconductor die and first die bond wires with an encapsulating material, wherein the encapsulating material forms an outer package base surface and an opposite planar surface and wherein each lead finger distal end is exposed from the encapsulating material at the outer package base surface and each lead finger proximal end is exposed from the encapsulating material at the opposite planar surface;
attaching a sensor die to the second side of the die paddle, the sensor die having a sensor active surface with sensor bonding pads and an opposite sensor surface attached to the second side of the die paddle;
selectively electrically connecting the sensor bonding pads to the proximal ends of the lead fingers with sensor bond wires;
covering the sensor die and the sensor bond wires with a footed lid mounted to the opposite planar surface of the encapsulating material, wherein the footed lid includes a hole in a surface thereof; and
separating the outer frame from the lead fingers and tie bars.

12. The method for assembling of claim 11, further comprising mounting a second semiconductor die on the active surface of the first semiconductor die.

13. The method for assembling of claim 12, further comprising selectively electrically connecting bonding pads on an active surface of the second semiconductor die to the proximal ends of the lead fingers with second die bonding wires.

14. The method for assembling of claim 12, further comprising selectively electrically connecting bonding pads on an active surface of the second semiconductor die to the first die bonding pads with second die bonding wires.

15. The method for assembling of claim 11, wherein covering the sensor die further includes covering the sensor die and the sensor bond wires with a gel material.

* * * * *